US006229330B1

United States Patent
Boochakorn

(10) Patent No.: US 6,229,330 B1
(45) Date of Patent: May 8, 2001

(54) CONTACTOR FLOOR THAT HOLDS AN IC PACKAGE TO CONTACTOR PINS WITHIN AN IC PACKAGE TESTING SYSTEM WITH MINIMIZED SOLDER FLAKING

(75) Inventor: Sa-Nguan Boochakorn, Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/390,838

(22) Filed: Sep. 7, 1999

(51) Int. Cl.[7] ................................................ G01R 31/26
(52) U.S. Cl. .............................. 324/765; 324/761; 439/70
(58) Field of Search .................................... 324/761, 765, 324/158.1; 439/70, 72, 73, 111, 330

(56) References Cited

U.S. PATENT DOCUMENTS 5,202,622 * 4/1993 Cole et al. ............................ 324/761
5,423,688 * 6/1995 Balyasny ................................ 439/70

* cited by examiner

*Primary Examiner*—Safet Metjahic
*Assistant Examiner*—Minh Tang
(74) *Attorney, Agent, or Firm*—Monica H. Choi

(57) ABSTRACT

A mechanism for positioning and coupling an integrated circuit package to a system for testing the integrated circuit package with minimized solder flaking. A contactor floor holds the integrated circuit package for moving the integrated circuit package within the system for testing the integrated circuit package. A respective contactor pin couples a corresponding lead of the integrated circuit package to the system for testing the integrated circuit package when the contactor floor moves the integrated circuit package to a testing position. The respective contactor pin further includes a positioning protrusion that protrudes toward a side wall of the contactor floor and that slides along the side wall of the contactor floor when the contactor floor is moving the integrated circuit package toward and away from the testing position with respect to the respective contactor pin. In addition, the respective contactor pin includes a contacting protrusion that is disposed above the positioning protrusion on the respective contactor pin and that protrudes toward the side wall of the contactor floor. An axis of the respective contactor pin is bent away from the side wall of the contactor floor at an angle such that the contacting protrusion is separated from the corresponding lead of the integrated circuit package with at least a predetermined avoidance distance when the contactor floor is moving the integrated circuit package toward and away from the testing position with respect to the respective contactor pin. With such a separation, the contactor pin does not scrape along the corresponding lead of the IC package to result in minimization of solder flaking.

17 Claims, 5 Drawing Sheets

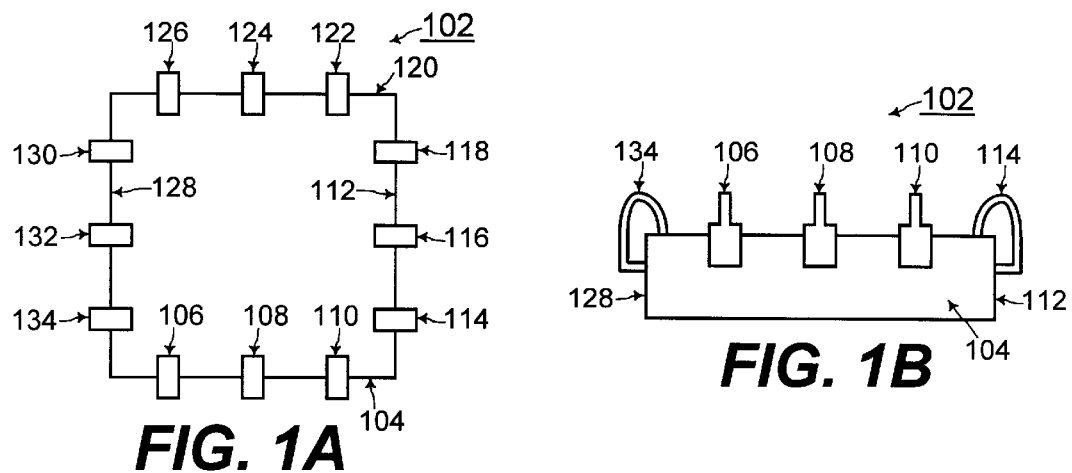
FIG. 1A
FIG. 1B
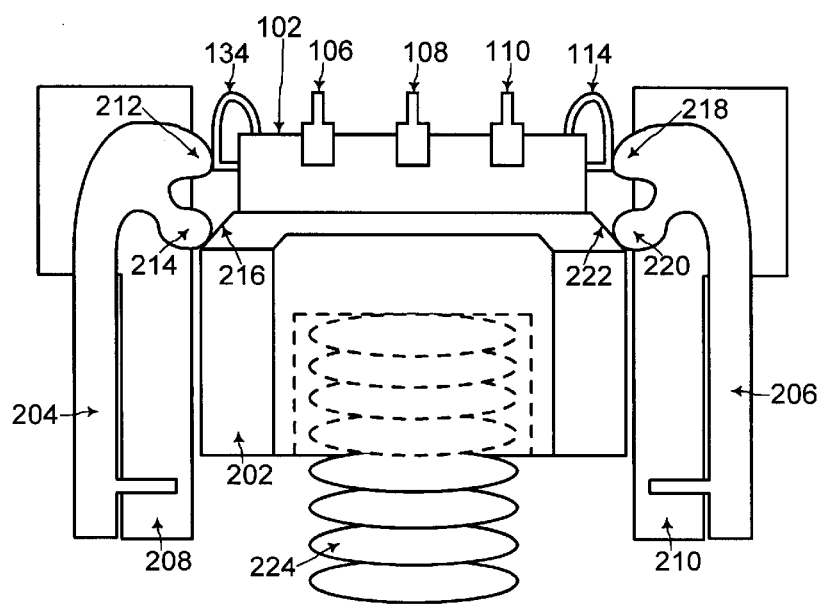
FIG. 2

US 6,229,330 B1

CONTACTOR FLOOR THAT HOLDS AN IC PACKAGE TO CONTACTOR PINS WITHIN AN IC PACKAGE TESTING SYSTEM WITH MINIMIZED SOLDER FLAKING

TECHNICAL FIELD

The present invention relates generally to IC (Integrated Circuit) package testing systems, and more particularly, to design of a contactor floor and contactor pins for coupling an IC package to an IC package testing system with minimized solder flaking.

BACKGROUND OF THE INVENTION

Referring to FIG. 1A, a typical IC (Integrated Circuit) package 102 includes a plurality of leads for coupling nodes of an IC die within the IC package 102 to a system external to the IC package 102. FIG. 1A shows a bottom view of the IC package 102. A first side 104 of the IC package 102 includes a first lead 106, a second lead 108, and a third lead 110. A second side 112 of the IC package 102 includes a fourth lead 114, a fifth lead 116, and a sixth lead 118. A third side 120 of the IC package 102 includes a seventh lead 122, an eighth lead 124, and a ninth lead 126. A fourth side 128 of the IC package 102 includes a tenth lead 130, an eleventh lead 132, and a twelfth lead 134. A typical IC package includes more numerous leads to a side of the IC package. However, three leads to a side of the IC package 102 are shown in FIG. 1A for clarity of illustration.

Referring to FIG. 1B, a side view of the first side 104 of the IC package 102 of FIG. 1A is shown. The side view of the first side 104 of the IC package 102 in FIG. 1B also shows a side view of the fourth lead 114 on the second side 112 of the IC package 102 and a side view of the twelfth lead 134 on the fourth side 128 of the IC package 102.

An IC package is tested for proper functionality by applying test signals to some of the plurality of leads of the IC package and by measuring resulting signals at some of the plurality of leads of the IC package. Thus, the plurality of leads of the IC package are coupled to a system for testing the IC package.

Referring to FIG. 2, the IC package 102 is mounted within an insert of a contactor floor 202 of such a system for testing an IC package. The IC package 102 is mounted on the contactor floor 202 with the plurality of leads facing up and away from the contactor floor 202. The contactor floor 202 holds the IC package 102 for moving the IC package 102 within the system for testing the IC package 102. A respective contactor pin of the system for testing the IC package is coupled to each of the plurality of leads 106, 108, 110, 114, 116, 118, 122, 124, 126, 130, 132, and 134 for coupling a corresponding lead to the system for testing the IC package. However, in FIG. 2, only a first contactor pin 204 for coupling the twelfth lead 134 of the IC package 102 and a second contactor pin 206 for coupling the fourth lead 114 of the IC package 102 to the system for testing the IC package 102 are shown for clarity of illustration.

The first contactor pin 204 is placed within a first contactor pin socket 208 that properly aligns the first contactor pin 204 to a desired position within the system for testing the IC package 102. The second contactor pin 206 is placed within a second contactor pin socket 210 that properly aligns the second contactor pin 206 to a desired position within the system for testing the IC package 102.

When the IC package 102 is in a testing position, a contacting protrusion 212 of the first contactor pin 204 makes contact with the twelfth lead 134 of the IC package 102 for coupling the twelfth lead 134 to the system for testing the IC package 102. Also, when the IC package 102 is in the testing position, a positioning protrusion 214 of the first contactor pin 204 may rest on an upper angled surface 216 of the contactor floor 202. The positioning protrusion 214 may further affect the position of the contacting protrusion 212 of the first contactor pin 204.

Similarly, when the IC package 102 is in the testing position, a contacting protrusion 218 of the second contactor pin 206 makes contact with the fourth lead 114 of the IC package 102 for coupling the fourth lead 114 to the system for testing the IC package 102. A positioning protrusion 220 of the second contactor pin 206 may rest on an upper angled surface 222 of the contactor floor 202. The positioning protrusion 220 may further affect the position of the contacting protrusion 218 of the second contactor pin 206.

The contactor floor 202 holds and moves the IC package 102 to and away from the testing position. In the testing position, a respective contactor pin makes contact with a corresponding one of each of the plurality of leads 106, 108, 110, 114, 116, 118, 122, 124, 126, 130, 132, and 134 for coupling that corresponding lead to the system for testing the IC package. In the testing position, the contactor floor moves the IC package 102 downward until the respective contactor pin makes contact with the corresponding lead of the IC package 102. Referring to FIG. 3, when the IC package 102 is not in the testing position, the contactor floor 102 moves the IC package 102 upward and away from the contactor pins. Elements having the same reference number in FIGS. 2 and 3 refer to elements having similar structure and function.

A compression spring 224 is disposed below the contactor floor 202 within an opening at the bottom of the contactor floor 202. Referring to FIG. 2, when the IC package 102 is moved to the testing position, the compression spring 224 is compressed as the contactor floor 202 is moved down with the IC package 202 toward the contactor pins. Referring to FIG. 3, when the IC package 102 is not in the testing position, the compression spring 224 is decompressed as the contactor floor 202 is moved upward with the IC package 102 away from the contactor pins.

Referring to FIG. 4, a top view of the contactor floor 202 of the prior art includes bilevel surfaces on each of the side wall of the contactor floor 202. A first indentation 402 is present on a first side wall 404 of the contactor floor 202 of the prior art, a second indentation 406 is present on a second side wall 408 of the contactor floor 202 of the prior art, a third indentation 410 is present on a third side wall 412 of the contactor floor 202 of the prior art, a fourth indention 414 is present on a fourth side wall 416 of the contactor floor 202 of the prior art.

Referring to FIGS. 3 and 4, a contactor pin fits within the indentation of a side wall of the contactor floor and slides along that side wall within that indentation as the contactor floor 202 of the prior art moves toward and away from the testing position with respect to the contactor pin. The indentation on a side wall of the contactor floor of the prior art ensures that the contactor pin is positioned sufficiently in toward the leads of the IC package 102 such that the contacting protrusion of the contactor pin makes contact with the corresponding lead of the IC package 102 when the IC package 102 is in the testing position with respect to the contactor pins.

However, as the contactor floor 202 of the prior art moves up and down for moving the IC package 102 toward and away from the testing position, the contacting protrusion of the contactor pin slides and scrapes along the corresponding lead. Referring to FIG. 5, the contactor floor 202 is moving the IC package 102 up with respect to the contactor pins toward the testing position. During such movement, the contacting protrusion 212 of the first contactor pin 204 scrapes along the twelfth lead 134 of the IC package 102, and the contacting protrusion 218 of the second contactor pin 206 scrapes along the fourth lead 114 of the IC package 102.

Referring to FIG. 6, the contactor floor 202 is moving the IC package 102 down with respect to the contactor pins away from the testing position after the IC package 102 has been tested. During such movement also, the contacting protrusion 212 of the first contactor pin 204 scrapes along the twelfth lead 134 of the IC package 102, and the contacting protrusion 218 of the second contactor pin 206 scrapes along the fourth lead 114 of the IC package 102.

Unfortunately, such scraping of the contactor pins along the leads results in solder flaking at the leads. With such repeated scraping of the contactor pins against the leads of an IC package during testing of numerous IC packages, the flaking solder particles build up to result in visible solder flakes at the leads of the IC package. Such visible solder flakes are considered to be an undesired cosmetic defect for an IC package.

In the prior art, such undesired solder flakes are visibly detected and manually removed from the IC package with a tweezer. In addition, to prevent formation of such solder flakes, the contactor pins are routinely cleaned or replaced before visibly noticeable solder flakes form on the leads of the IC package. However, such manual detection and removal of the solder flakes and the cleaning or replacement of the contactor pins slows down production of IC packages. However, testing of the IC package is also desired before the IC package is shipped to a customer.

Thus, a mechanism is desired for minimizing the formation of undesired solder flakes at the leads of an IC package during movement and placement of the IC package to the contactor pins within a system for testing the IC package.

SUMMARY OF THE INVENTION

Accordingly, a general aspect of the present invention includes an apparatus and method for positioning and coupling an IC package to a system for testing the IC package with minimized solder flaking. The IC package has a plurality of leads that are coupled to the system for testing the IC package.

In an aspect of the present invention, a contactor floor holds the integrated circuit package for moving the integrated circuit package within the system for testing the integrated circuit package. A respective contactor pin couples a corresponding lead of the integrated circuit package to the system for testing the integrated circuit package when the contactor floor moves the integrated circuit package to a testing position. The respective contactor pin further includes a positioning protrusion that protrudes toward a side wall of the contactor floor and that slides along the side wall of the contactor floor when the contactor floor is moving the integrated circuit package toward and away from the testing position with respect to the respective contactor pin. In addition, the respective contactor pin includes a contacting protrusion that is disposed above the positioning protrusion on the respective contactor pin and that protrudes toward the side wall of the contactor floor. An axis of the respective contactor pin is bent away from the side wall of the contactor floor at an angle of theta such that the contacting protrusion is separated from the corresponding lead of the integrated circuit package with at least a predetermined avoidance distance when the contactor floor is moving the integrated circuit package toward and away from the testing position with respect to the respective contactor pin. Furthermore, the positioning protrusion moves in toward the integrated circuit package to rest on an upper angled surface of the contactor floor such that the contacting protrusion makes contact with the corresponding lead of the integrated circuit package when the integrated circuit package reaches the testing position with respect to the respective contactor pin.

In this manner, the contactor floor and the contactor pin are designed in the present invention to minimize scraping between the contactor pin and the corresponding lead of the IC package when the contactor floor moves the IC package to and away from the testing position.

These and other features and advantages of the present invention will be better understood by considering the following detailed description of the invention which is presented with the attached drawings.

BRIEF DESCRIPTION OF THE DRAWINGS

FIG. 1A shows a plurality of leads at the bottom of an example IC package, and FIG. 1B shows a side view of the IC package of FIG. 1A;

FIG. 2 shows an example contactor floor for holding and positioning an IC package to the contactor pins of a system for testing the IC package when the IC package is in a testing position;

The figures referred to herein are drawn for clarity of illustration and are not necessarily drawn to scale. Elements having the same reference number in FIGS. 1A, 1B, 2, 3, 4, 5, 6, 7, 8, 9, and 10 refer to elements having similar structure and function.

DETAILED DESCRIPTION

Figure 7:
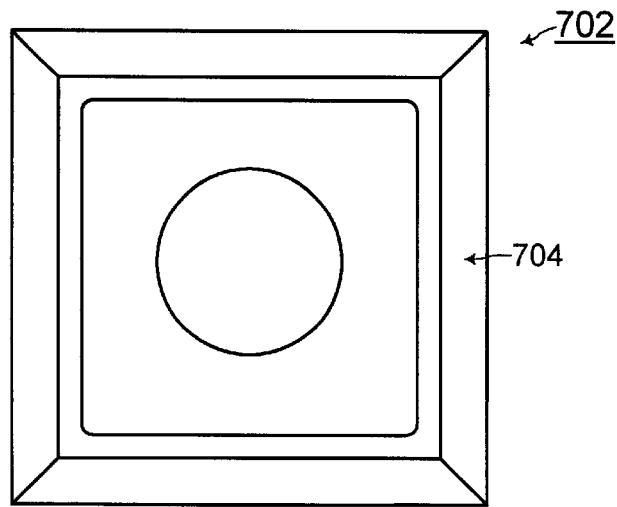
FIG. 7 shows a top view of a contactor floor of the present invention for preventing scraping of the contactor pins along the leads of the IC package, according to an embodiment of the present invention.

Referring to FIG. 7, for minimizing solder flaking at the leads of the IC package 102, the side walls of a contactor floor 702 of the present invention are not indented. Comparing FIGS. 4 and 7, each side wall of the contactor floor 702 of the present invention is a flat level surface. Each side wall of the contactor floor 702 of the present invention 10 also includes an upper angled surface 704 that slopes outward from the upper surface of the contactor floor 702 and that slopes downward from the upper surface of the contactor floor 702 at an angle of approximately 45°.

Figure 8:
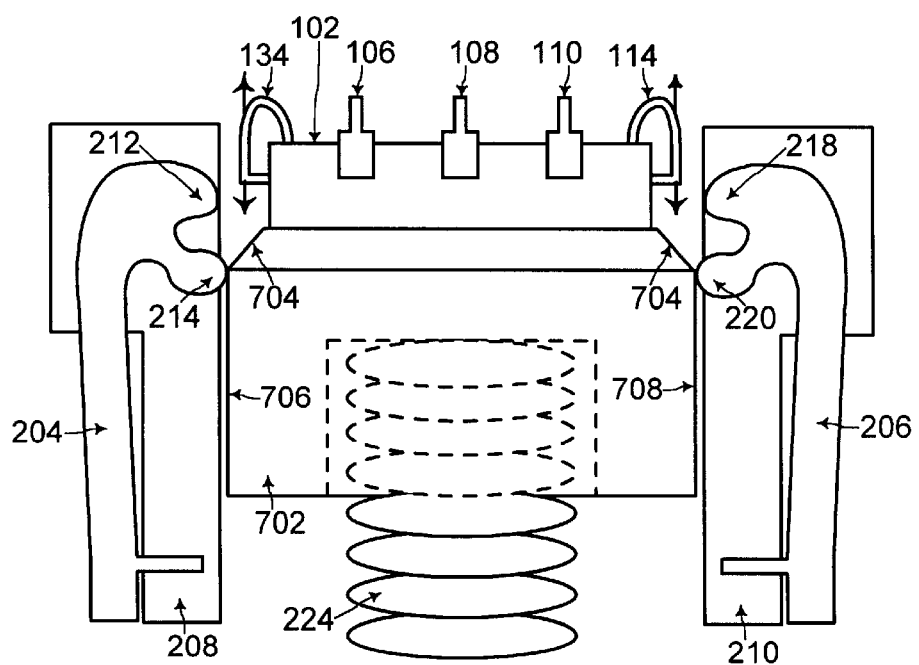
FIG. 8 illustrates operation of the contactor floor of the present invention when moving the IC package toward or away from the testing position without scraping of the contactor pins along the leads of the IC package, according to an embodiment of the present invention.

Referring to FIG. 8, the contactor floor 702 of the present invention is used for holding and aligning the IC package 102 within the system for testing the IC package 102. The positioning protrusion 214 of the first contactor pin 204 slides along a side wall 706 of the contactor floor 702 as the contactor floor 702 moves the IC package 102 toward and away from the testing position. Similarly, the positioning protrusion 220 of the second contactor pin 206 slides along a side wall 708 of the contactor floor 702 as the contactor floor 702 moves the IC package 102 toward and away from the testing position.

Figure 3:
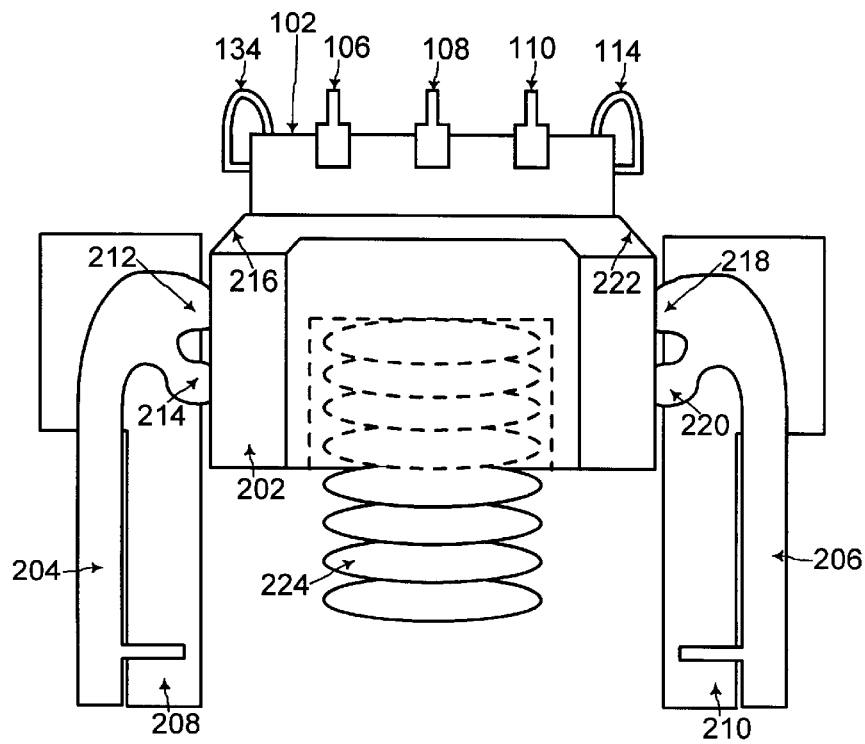
FIG. 3 shows the contactor floor of FIG. 2 holding and positioning the IC package to the contactor pins of the system for testing the IC package when the IC package is not in the testing position, according to the prior art.
Figure 4:
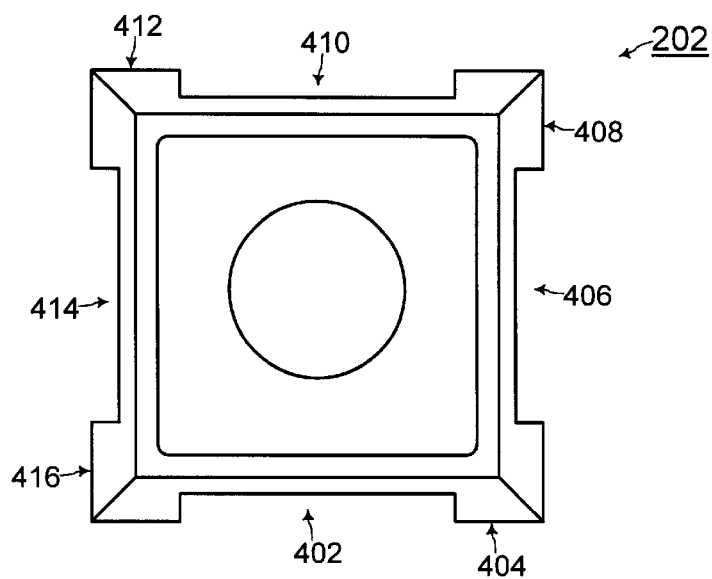
FIG. 4 shows a top view of a contactor floor of the prior art.
Figure 5:
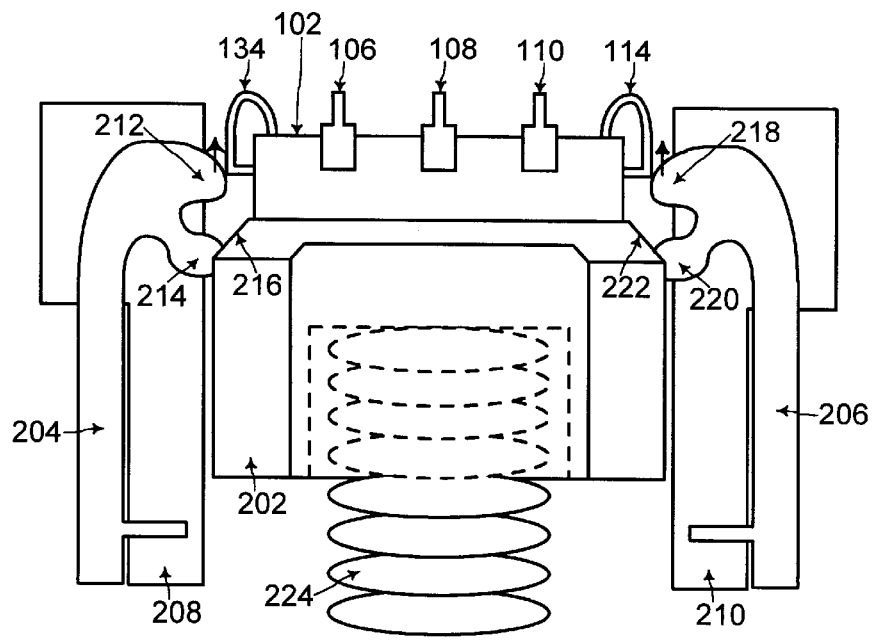
FIG. 5 illustrates the contactor floor of the prior art moving the IC package toward the testing position with scraping of the contactor pins along the leads of the IC package, according to the prior art.
Figure 6:
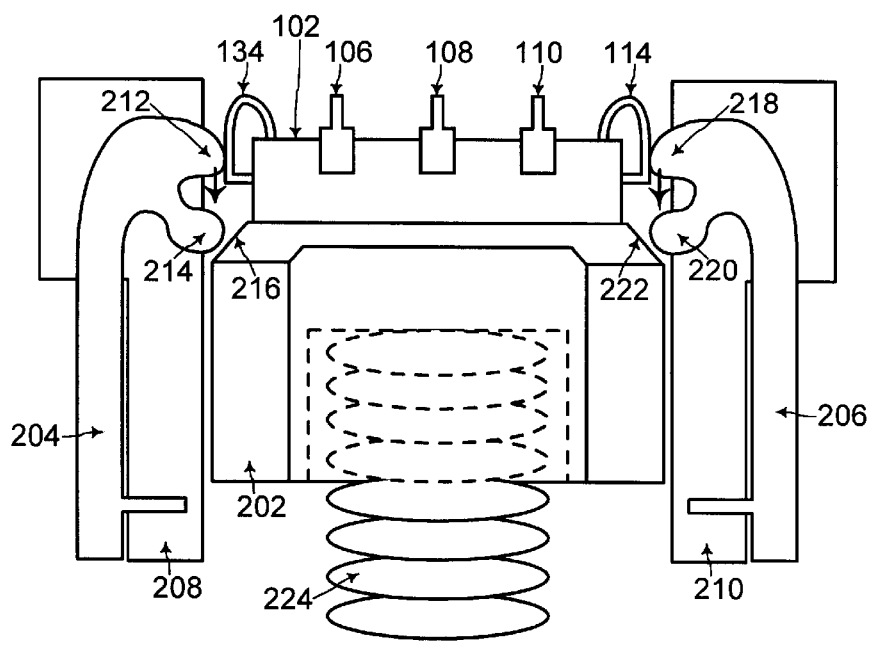
FIG. 6 illustrates the contactor floor of the prior art moving the IC package away from the testing position with scraping of the contactor pins along the leads of the IC package, according to the prior art.

In contrast to the contactor floor 202 of the prior art in FIG. 4, the side walls of the contactor floor 702 of the present invention in FIG. 7 are not indented. Thus, as the positioning protrusions 214 of the first contactor pin 204 slides along the side wall 706 of the contactor floor 702, the vertical axis of the first contactor pin 204 is bent away from the side wall 706 of the contactor floor 702 at an angle of θ° (theta degrees). Similarly, as the positioning protrusions 220 of the second contactor pin 206 slides along the side wall 708 of the contactor floor 702, the vertical axis of the second contactor pin 206 is bent away from the side wall 708 of the contactor floor 702 at an angle of θ° (theta degrees).

As illustrated in FIG. 8, because of such bending away of the first contactor pin 204, the contacting protrusion 212 of the first contactor pin 204 does not make contact with the twelfth lead 134 of the IC package 102 as the contactor floor 702 moves the IC package 102 toward and away from the testing position. The contacting protrusion 212 of the first contactor pin 204 is separated from the twelfth lead 134 of the IC package 102 by at least a predetermined avoidance distance as the contactor floor 702 moves the IC package 102 toward and away from the testing position.

Similarly, because of such bending away of the second contactor pin 206, the contacting protrusion 218 of the second contactor pin 206 does not make contact with the fourth lead 114 of the IC package 102 as the contactor floor 702 moves the IC package 102 toward and away from the testing position. The contacting protrusion 218 of the second contactor pin 206 is separated from the fourth lead 114 of the IC package 102 by at least a predetermined avoidance distance as the contactor floor 702 moves the IC package 102 toward and away from the testing position.

Figure 9:
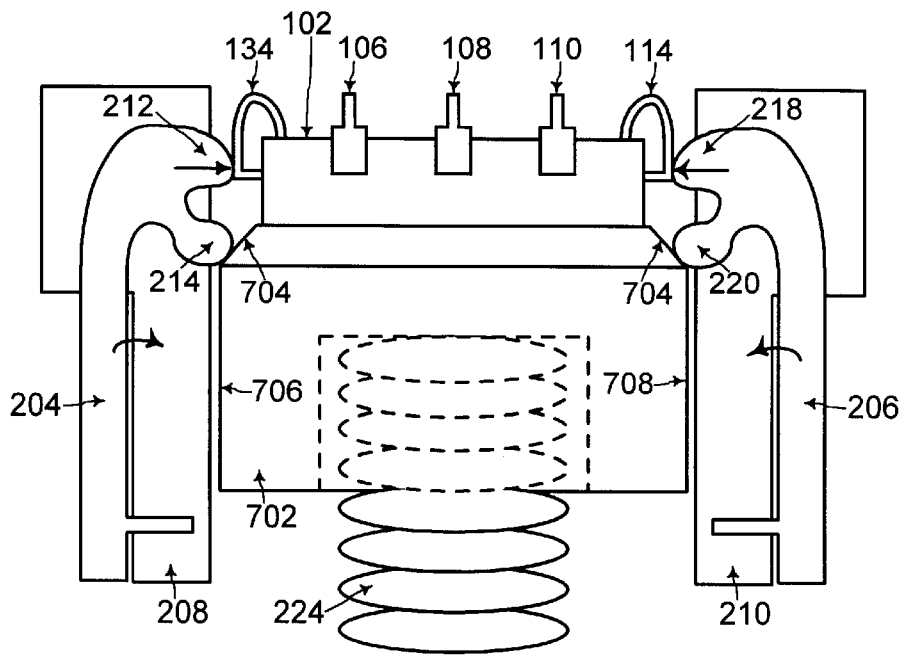
FIG. 9 illustrates operation of the contactor floor and the contactor pins of the present invention when the IC package reaches the testing position, according to an embodiment of the present invention.

Referring to FIG. 9, when the IC package 102 reaches the testing position, the contactor floor 702 has moved downward with respect to the contactor pins 204 and 206 such that the positioning protrusion 214 of the first contactor pin 204 and the positioning protrusion 220 of the second contactor pin 206 reach the upper angled surface 704 of the contactor floor 702. With such alignment, the positioning protrusion 214 of the first contactor pin 204 slides in toward the IC package 102 to rest on the upper angled surface 704 of the contactor floor 702 as the first contactor pin 204 springs back in toward the IC package 102. Thus, the vertical axis of the first contactor pin 204 becomes substantially parallel to the side wall 706 of the contactor floor 702 when the IC package 102 reaches the testing position. With this action of the first contactor pin 204, the contacting protrusion 212 of the first contactor pin 204 makes contact with the twelfth lead 134 of the IC package 102 when the IC package 102 reaches the testing position.

Similarly, the positioning protrusion 220 of the second contactor pin 206 slides in toward the IC package 102 to rest on the upper angled surface 704 of the contactor floor 702 as the second contactor pin 206 springs back in toward the IC package 102. Thus, the vertical axis of the second contactor pin 206 becomes substantially parallel to the side wall 708 of the contactor floor 702 when the IC package 102 reaches the testing position. With this action of the second contactor pin 206, the contacting protrusion 218 of the second contactor pin 206 makes contact with the fourth lead 114 of the IC package 102 when the IC package 102 reaches the testing position.

In this manner, referring to FIGS. 8, the contactor pins 204 and 206 do not scrape along the leads 134 and 114, respectively, as the contactor floor 702 of the present invention moves the IC package 102 toward and away from the testing position. Referring to FIG. 9, when the IC package 102 reaches the testing position with respect to the contactor pins 204 and 206, the contactor pins 204 and 206 spring in toward the IC package 102 to make contact with the leads of the IC package 102.

When the IC package 102 reaches the testing position, the contacting protrusion 212 of the first contactor pin 204 is aligned to the corresponding twelfth lead 134 of the IC package 102, and the contacting protrusion 218 of the second contactor pin 206 is aligned to the corresponding fourth lead 114 of the IC package 102. Thus, when the contactor pins 204 and 206 spring in toward the IC package 102, the contacting protrusion 212 of the first contactor pin 204 makes contact with the corresponding twelfth lead 134 of the IC package 102, and the contacting protrusion 218 of the second contactor pin 206 makes contact with the fourth lead 114 of the IC package 102.

However, referring to FIG. 8, before the IC package 102 reaches the testing position with respect to the contactor pins 204 and 206, the contacting protrusion 212 of the first contactor pin 204 is separated from the twelfth lead 134 of the IC package 102 by at least a predetermined avoidance distance as the contactor floor 702 moves the IC package 102 toward and away from the testing position. Similarly, the contacting protrusion 218 of the second contactor pin 206 is separated from the fourth lead 114 of the IC package 102 by at least a predetermined avoidance distance as the contactor floor 702 moves the IC package 102 toward and away from the testing position.

Thus, since the contactor pins 204 and 206 do not scrape along the respective leads of the IC package 102 as the contactor floor 702 moves the IC package 102 toward and away from the testing position, solder flaking is minimized with the present invention. Such minimization of solder flaking avoids the need for manual removal of the undesired solder flakes from the IC package 102 and avoids the need for cleaning or replacement of the contactor pins.

Figure 10:
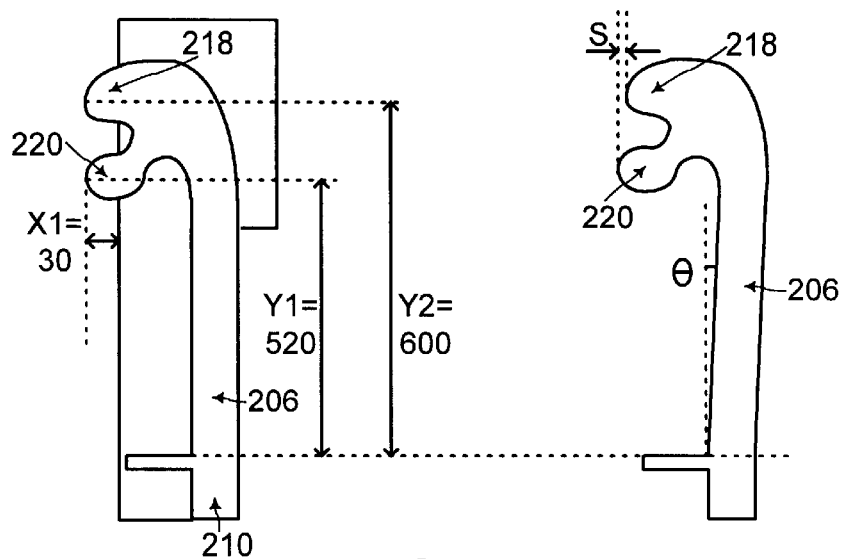
FIG. 10 illustrates the determination of a predetermined avoidance distance between the contactor pins and the leads of the IC package when the contactor floor of the present invention moves the IC package toward or away from the testing position, according to an embodiment of the present invention.

FIG. 10 illustrates an example calculation of the predetermined avoidance distance between the contacting protrusion of a contactor pin and the corresponding lead on the IC package as the contactor floor 702 moves the IC package 102 toward and away from the testing position. Referring to FIG. 10, Y1 is a vertical height of the positioning protrusion 220 of the contactor pin 206, and Y2 is a vertical height of the contacting protrusion 218 of the contactor pin 206. X1 is a distance from the outer edge of the contacting protrusion 220 of the contactor pin 206 to the edge of the socket 210 holding the contactor pin 206.

Referring to FIGS. 8 and 10, θ(theta) is the angle of the vertical axis of the contactor pin 206 with respect to the side wall 708 of the contactor floor 702 when the contactor pin 206 is bent away from the contactor floor 702 as the contactor pin 206 slides along the side wall 708 of the contactor floor 702 as shown in FIG. 8. S is the predetermined avoidance distance from the edge of the positioning protrusion 220 to the edge of the contacting protrusion 218 of the contactor pin 206 when the contactor pin 206 is bent away from the contactor floor 702 with the angle of θ (theta) as the contactor pin 206 slides along the side wall 708 of the contactor floor 702.

Some example values are shown in FIG. 10 with X1=30 mils (with 1 mil being equal to one thousandth of an inch), Y1=520 mils, and Y2=600 mils in the design of the contactor pin 206. The following equations result in calculating the predetermined avoidance distance, S:

$$\tan(\theta)=X1/Y1=30/520=0.0577;$$

$$\theta=3.3°;$$

$$X1+S=Y2*\tan(\theta)=600*\tan(3.3°)=34.63 \text{ mils};$$

S=4.63 mils.

Referring to FIG. 8, before the IC package 102 reaches the testing position with respect to the contactor pins 204 and 206, the contacting protrusion 212 of the first contactor pin 204 is separated from the twelfth lead 134 of the IC package 102 by at least the predetermined avoidance distance, S, as the contactor floor 702 moves the IC package 102 toward and away from the testing position. Similarly, the contacting protrusion 218 of the second contactor pin 206 is separated from the fourth lead 114 of the IC package 102 by at least the predetermined avoidance distance, S, as the contactor floor 702 moves the IC package 102 toward and away from the testing position. With such separation of the contactor pins from the leads of the IC package, solder flaking is minimized with the present invention.

The foregoing is by way of example only and is not intended to be limiting. For instance, the IC package 102 is by way of example only. A typical IC package 102 may have more numerous leads. In addition, the shape of the contactor pins 204 and 206 are by way of example only, and the present invention may be advantageously practiced with any type of contactor pins having a contacting protrusion that should not scrape the leads of the IC package as the IC package is moved toward and away from the testing position within the system for testing the IC package.

Furthermore, as will be understood by those skilled in the art, the IC structures described herein may be made or used in the same way regardless of their position and orientation. Accordingly, it is to be understood that terms and phrases such as "bottom," "up," "down," and "side wall" as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

I claim:

1. An apparatus for positioning and coupling an integrated circuit package to a system for testing said integrated circuit package, with minimized solder flaking, said integrated circuit package having a plurality of leads, the apparatus comprising:

a contactor floor that holds said integrated circuit package for moving said integrated circuit package within said system for testing said integrated circuit package; and a respective contactor pin for coupling a corresponding lead of said integrated circuit package to said system for testing said integrated circuit package when said contactor floor moves said integrated circuit package to a testing position, said respective contactor pin further comprising:

a positioning protrusion that protrudes toward a side wall of said contactor floor and that slides along said side wall of said contactor floor when said contactor floor is moving said integrated circuit package toward and away from said testing position with respect to said respective contactor pin; and a contacting protrusion that is disposed above said positioning protrusion on said respective contactor pin and that protrudes toward said side wall of said contactor floor;

and wherein an axis of said respective contactor pin is bent away from said side wall of said contactor floor at an angle of theta by having said contacting protrusion not contact said side wall of said contactor floor and said corresponding lead of said integrated circuit package while said positioning protrusion slides along said side wall of said contactor floor, such that said contacting protrusion is separated from said corresponding lead of said integrated circuit package with at least a predetermined avoidance distance when said contactor floor is moving said integrated circuit package toward and away from said testing position with respect to said respective contactor pin;

and wherein said positioning protrusion moves in toward said integrated circuit package to rest on an upper angled surface of said contactor floor such that said contacting protrusion makes contact with said corresponding lead of said integrated circuit package when said integrated circuit package reaches said testing position with respect to said respective contactor pin.

2. The apparatus of claim 1, wherein said axis of said respective contactor pin is parallel with said side wall of said contactor floor when said integrated circuit package reaches said testing position with respect to said respective contactor pin such that said contacting protrusion makes contact with said corresponding lead of said integrated circuit package.

3. The apparatus of claim 1, wherein said contactor floor holds said integrated circuit package with said plurality of leads on said integrated circuit package facing up and away from said contactor floor.

4. The apparatus of claim 1, wherein said side wall of said contactor floor is a flat level surface.

5. The apparatus of claim 1, further comprising:

a compression spring disposed below said contactor floor, said compression spring being compressed when said contactor floor moves said integrated circuit package to said testing position with respect to said respective contactor pin, and said compression spring being decompressed when said contactor floor moves said integrated circuit package away from said testing position with respect to said respective contactor pin.

6. The apparatus of claim 1, further comprising:
a respective socket corresponding to said respective contactor pin for aligning said respective contactor pin to a desired position.

7. The apparatus of claim 1, wherein said upper angled surface of said contactor floor is sloped outward and downward at an angle of approximately 45 degrees from an edge of an upper surface of said contactor floor.

8. An apparatus for positioning and coupling an integrated circuit package to a system for testing said integrated circuit package, with minimized solder flaking, said integrated circuit package having a plurality of leads, the apparatus comprising:
a contactor floor that holds said integrated circuit package for moving said integrated circuit package within said system for testing said integrated circuit package;
a respective contactor pin for coupling a corresponding lead of said integrated circuit package to said system for testing said integrated circuit package when said contactor floor moves said integrated circuit package to a testing position, said respective contactor pin further comprising:
  a positioning protrusion that protrudes toward a side wall of said contactor floor and that slides along said side wall of said contactor floor when said contactor floor is moving said integrated circuit package toward and away from said testing position with respect to said respective contactor pin; and
  a contacting protrusion that is disposed above said positioning protrusion on said respective contactor pin and that protrudes toward said side wall of said contactor floor;
means for maintaining said contacting protrusion separated from said corresponding lead of said integrated circuit package with at least a predetermined avoidance distance by having said contacting protrusion not contact said side wall of said contactor floor and said corresponding lead of said integrated circuit package while said positioning protrusion slides along said side wall of said contactor floor as said contactor floor moves said integrated circuit package toward and away from said testing position with respect to said contactor floor; and
means for coupling said contacting protrusion to said corresponding lead of said integrated circuit package when said integrated circuit package reaches said testing position with respect to said respective contactor pin.

9. The apparatus of claim 8, wherein said contactor floor holds said integrated circuit package with said plurality of leads on said integrated circuit package facing up and away from said contactor floor.

10. The apparatus of claim 8, wherein said side wall of said contactor floor is a flat level surface.

11. The apparatus of claim 8, further comprising:
a compression spring disposed below said contactor floor, said compression spring being compressed when said contactor floor moves said integrated circuit package to said testing position with respect to said respective contactor pin, and said compression spring being decompressed when said contactor floor moves said integrated circuit package away from said testing position with respect to said respective contactor pin.

12. The apparatus of claim 8, further comprising:
a respective socket corresponding to said respective contactor pin for aligning said respective contactor pin to a desired position.

13. A method for positioning and coupling an integrated circuit package to a system for testing said integrated circuit package, with minimized solder flaking, said integrated circuit package having a plurality of leads, the method including the steps of:
A. holding and moving said integrated circuit package using a contactor floor within said system for testing said integrated circuit package;
B. coupling a corresponding lead of said integrated circuit package to said system for testing said integrated circuit package via a respective contactor pin when said contactor floor moves said integrated circuit package to a testing position;
  and wherein said respective contactor pin includes a positioning protrusion that protrudes toward a side wall of said contactor floor and that slides along said side wall of said contactor floor when said contactor floor is moving said integrated circuit package toward and away from said testing position with respect to said respective contactor pin; and
  and wherein said respective contactor pin includes a contacting protrusion that is disposed above said positioning protrusion on said respective contactor pin and that protrudes toward said side wall of said contactor floor;
C. bending an axis of said respective contactor pin away from said side wall of said contactor floor at an angle of theta by having said contacting protrusion not contact said side wall of said contactor floor and said corresponding lead of said integrated circuit package while said positioning protrusion slides along said side wall of said contactor floor such that said contacting protrusion is separated from said corresponding lead of said integrated circuit package with at least a predetermined avoidance distance when said contactor floor moves said integrated circuit package toward and away from said testing position with respect to said respective contactor pin; and
D. moving said positioning protrusion in toward said integrated circuit package to rest on an upper angled surface of said contactor floor such that said contacting protrusion makes contact with said corresponding lead of said integrated circuit package when said integrated circuit package reaches said testing position with respect to said respective contactor pin.

14. The method of claim 13, wherein said axis of said respective contactor pin is parallel with said side wall of said contactor floor when said integrated circuit package reaches said testing position with respect to said respective contactor pin such that said contacting protrusion makes contact with said corresponding lead of said integrated circuit package.

15. The method of claim 13, further including the step of:
placing said integrated circuit package on said contactor floor with said plurality of leads on said integrated circuit package facing up and away from said contactor floor.

16. The method of claim 13, wherein said side wall of said contactor floor is a flat level surface.

17. The method of claim 13, further including the step of:
aligning said respective contactor pin to a desired position by placing said respective contactor pin within a respective socket.

* * * * *